United States Patent [19]
Uno et al.

[11] Patent Number: 5,827,604
[45] Date of Patent: Oct. 27, 1998

[54] MULTILAYER PRINTED CIRCUIT BOARD AND METHOD OF PRODUCING THE SAME

[75] Inventors: Hiroaki Uno; Masato Kawade, both of Gifu, Japan

[73] Assignee: Ibiden Co., Ltd., Gifu, Japan

[21] Appl. No.: 682,629

[22] PCT Filed: Dec. 1, 1995

[86] PCT No.: PCT/JP95/02460

§ 371 Date: Jul. 31, 1996

§ 102(e) Date: Jul. 31, 1996

[87] PCT Pub. No.: WO96/17503

PCT Pub. Date: Jun. 6, 1996

[30] Foreign Application Priority Data

Dec. 1, 1994 [JP] Japan ................................. 6-298626
Aug. 25, 1995 [JP] Japan ................................. 7-238938

[51] Int. Cl.$^6$ ............................ H05K 3/46; H05K 3/38
[52] U.S. Cl. ................... 428/209; 428/131; 428/418; 428/458; 428/901; 106/1.23; 106/1.26; 106/1.27; 427/305; 427/437; 427/443.1; 522/100; 523/428; 525/406; 525/407; 525/396
[58] Field of Search ..................... 428/418, 209, 428/901, 131, 458; 427/96; 106/305, 437, 443.1; 522/100; 523/428; 525/406, 407, 396

[56] References Cited

U.S. PATENT DOCUMENTS

| | | | |
|---|---|---|---|
| 2,929,742 | 3/1960 | Minjer et al. | 427/438 |
| 3,046,159 | 7/1962 | Brookshire | 117/130 |

(List continued on next page.)

FOREIGN PATENT DOCUMENTS

| | | |
|---|---|---|
| 0324189 | 7/1989 | European Pat. Off. . |
| 57-501786 | 10/1982 | Japan . |

(List continued on next page.)

OTHER PUBLICATIONS

English Language Abstract of Japanese Application No. 2–29284.
English language Abstract of Japan Application No. 3–283389.
Patent Abstracts of Japan, vol. 15, No. 90 (E–1040) Mar. 1991.
Copy of the International Search Report in English and Japanese.
English Language Abstract of JP 6–283860.
English Language Abstract of JP 2–241087.
English Language Abstract of JP 6–275950.
English Language Abstract of JP 5–335744.
English Language Abstract of JP 4–314397.
English Language Abstract of JP 4–284690.
English Language Abstract of JP 64–13794.
English Language Abstract of JP 61–266241.
English Language Abstract of JP 2–277292.
English Language Abstract of JP 4–40270.
English Language Abstract of JP 4–354897.
English Language Abstract of JP 4–45279.
International Search Report.
Blank copies of the PTO 1449 Form submitted with the Oct. 30, 1996 disclosure statement.

Primary Examiner—Cathy F. Lam
Attorney, Agent, or Firm—Greenblum & Bernstein, P.L.C.

[57] ABSTRACT

This invention is to provide a multilayer printed circuit board having excellent appearance and reliability and a method of producing the same, and proposes a build-up multilayer printed circuit board comprising an interlaminar insulating layer 4 comprised of an adhesive for additive process between an inner layer copper pattern 3 provided at its surface with a fine uneven layer 9 and an outer layer copper pattern 6 in which the surface of uneven layer 9 in the inner layer copper pattern 3 is covered with a metal layer containing one or more of metals having an ionization tendency not lower than that of copper but not higher than that of titanium, or a noble metal layer 10, and a production technique therefor.

20 Claims, 5 Drawing Sheets

U.S. PATENT DOCUMENTS

| | | |
|---|---|---|
| 3,547,784 | 12/1970 | Bernhardt et al. .......................... 204/20 |
| 3,832,168 | 8/1974 | Gulla .......................................... 75/170 |
| 4,167,416 | 9/1979 | Zolla ........................................ 106/1.25 |
| 4,265,943 | 5/1981 | Goldstein et al. ....................... 427/305 |
| 4,397,812 | 8/1983 | Mallory et al. .......................... 420/441 |
| 4,482,596 | 11/1984 | Gulla et al. .............................. 428/131 |
| 4,752,499 | 6/1988 | Enomoto .................................... 427/98 |
| 4,777,078 | 10/1988 | Miyabayashi ........................... 428/211 |
| 4,913,768 | 4/1990 | Wolf et al. ............................... 156/645 |
| 5,021,472 | 6/1991 | Enomoto .................................. 523/427 |
| 5,055,321 | 10/1991 | Enomoto et al. .......................... 427/98 |
| 5,344,893 | 9/1994 | Asai et al. ............................... 525/398 |
| 5,447,996 | 9/1995 | Asai et al. ............................... 525/398 |
| 5,517,758 | 5/1996 | Nakamura ................................. 29/852 |
| 5,523,174 | 6/1996 | Tamaki .................................... 428/669 |

FOREIGN PATENT DOCUMENTS

| | | |
|---|---|---|
| 61-266241 | 11/1986 | Japan . |
| 62-20878 | 1/1987 | Japan . |
| 63-44822 | 9/1988 | Japan . |
| 63-266076 | 11/1988 | Japan . |
| 64-13794 | 1/1989 | Japan . |
| 6413794 | 1/1989 | Japan . |
| 2-241087 | 9/1990 | Japan . |
| 2241087 | 9/1990 | Japan . |
| 2-277292 | 11/1990 | Japan . |
| 2277292 | 11/1990 | Japan . |
| 2292894 | 12/1990 | Japan . |
| 3283389 | 12/1991 | Japan . |
| 4-40270 | 2/1992 | Japan . |
| 4-45279 | 2/1992 | Japan . |
| 440270 | 2/1992 | Japan . |
| 445279 | 2/1992 | Japan . |
| 4116176 | 4/1992 | Japan . |
| 4-284690 | 10/1992 | Japan . |
| 4284690 | 10/1992 | Japan . |
| 4-314397 | 11/1992 | Japan . |
| 4314397 | 11/1992 | Japan . |
| 4-354897 | 12/1992 | Japan . |
| 4354897 | 12/1992 | Japan . |
| 5-335744 | 12/1993 | Japan . |
| 5335744 | 12/1993 | Japan . |
| 6-275950 | 9/1994 | Japan . |
| 6275950 | 9/1994 | Japan . |
| 6-283860 | 10/1994 | Japan . |
| 6283860 | 10/1994 | Japan . |
| 8201015 | 4/1982 | WIPO . |

MULTILAYER PRINTED CIRCUIT BOARD AND METHOD OF PRODUCING THE SAME

TECHNICAL FIELD

This invention relates to a multilayer printed circuit board and a method of producing the same.

BACKGROUND ART

Heretofore, a build-up multilayer printed circuit board interposing an interlaminar insulating layer between an outer layer copper pattern and an inner layer copper pattern has been produced, for example, through the following processes ①–⑨. That is, it is a series of the processes comprising;

① formation of an inner layer (underlayer) copper pattern on a substrate,

② formation of an interlaminar insulating layer by application of an adhesive for the electroless plating, ③ formation of an opening portion for the formation of viahole to the interlaminar insulating layer, ④ roughening of the interlaminar insulating layer by treatment with acid, oxidizing agent or the like, ⑤ formation of a hole for the formation of through-hole and desmier treatment (removal of cutting resin dust in the hole through a chemical treatment), ⑥ formation of a catalyst nucleus, ⑦ formation of a plating resist, ⑧ activation treatment with sulfuric acid or the like, ⑨ formation of an outer layer (top layer) copper pattern through electroless copper plating.

On the other hand, in the production process of this type of-the multilayer printed circuit board, the uneven layer is formed on the surface of the inner layer (underlayer) copper pattern, for example, by carrying out copper-nickel-phosphorus plating treatment or the like prior to the above step ② for improving the adhesion property between the inner layer copper pattern and the interlaminar insulating layer.

In the above production process, however, a part of the surface layer of the inner layer (underlayer) copper pattern is rendered into an exposed state outward from the interlaminar insulating layer by forming the opening for the formation of viahole or the hole for the formation of through-hole. As a result, the exposed surface portion of the inner layer copper pattern is directly exposed to a roughening solution of an adhesive layer for electroless plating such as phosphoric acid, chromic acid or the like, or a soft etching solution such as sodium persulfate or the like at the subsequent step. In this case, there are caused drawbacks that the inner layer copper pattern is discolored around the viahole, and that the surface portion of the inner layer copper pattern is dissolved (so-called hallow phenomenon is caused), and the like. As a result, there is a problem of damaging the appearance of the resulting multilayer printed circuit board.

Furthermore, when the dissolution of the surface portion (uneven layer) is promoted to dissolve the inner layer (underlayer) copper pattern itself, not only the appearance but also the adhesion property between the interlaminar insulating layer and the inner layer copper pattern and plate followed property plate connection are degraded (see microphotographs shown in FIGS. 7(a)–(c)). As a result, there is caused a problem that the reliability of the multilayer printed circuit board is damaged.

As the technique for preventing the dissolution corrosion of the copper pattern, there have hitherto been proposed ① a technique of forming an electric plated layer of copper, cobalt or nickel and then subjecting to a rust-preventive treatment in JP-A-2-292894, and ② a rust-preventive technique of forming a roughened surface provided with a thermal deterioration preventive layer with a copper plating bath containing at least one metal selected from zinc, tin and cobalt and then subjecting this surface to a chromate treatment in JP-A-3-283389.

As a technique of forming the uneven layer (roughened layer) on the copper pattern, there has hitherto been proposed ③ a technique wherein a homogeneously roughened electroless copper plated film is formed through an alloy plating of copper, nickel and phosphorus to improve an adhesion property to a prepreg in JP-A-4-116176.

In the technique described in JP-A-2-292894, the chromium oxide is used as a rust-preventive material and is not electrically conductive, so that it is impossible to apply to the via-hole as defined in the invention.

When the technique described in JP-A-3-283389 is applied to an additive type circuit board, chromium is rapidly dissolved in the roughening solution of the adhesive for electroless plating such as hydrochloric acid or sulfuric acid, so that this technique can not be applied to the board.

The technique described in JP-A-4-116176 is not a technique for preventing the dissolution corrosion of the copper pattern.

It is, therefore, an object of the invention to solve the aforementioned problems of the conventional technique and to provide a multilayer printed circuit board having excellent appearance and reliability and a method of producing the same.

It is another object of the invention to provide a multilayer printed circuit board having excellent appearance and reliability without causing no problem in any case of observing the appearance and section, the presence or absence of gap between uneven layer and interlaminar insulating layer and the presence or absence of cracking after the heat cycle test and a method of the producing the same.

It is the other object of the invention to provide a multilayer printed circuit board having excellent appearance and reliability without causing problems even under conditions of high temperature, high pressure and high humidity in addition to the above reliability and a method of producing the same.

SUMMARY OF THE INVENTION

The inventors have made various studies for achieving the above object. As a result, it has been found that the cause of discoloring the inner layer copper pattern lies in a point that the alloy plated layer (uneven layer) formed on the surface portion of the inner layer copper pattern is ant to be dissolved with acid or oxidizing agent and a gap causing the discoloration is created between the interlaminar insulating layer and the alloy plated layer.

When the dissolution of the alloy plated layer is promoted, Pd as a catalyst nucleus for the alloy plating is exposed to cause local electrode reaction of Cu and Pd in a solution of acid or oxidizing agent according to the following reaction formulae:

$$Cu \rightarrow Cu^{2+} + 2e^-$$

$$2H^+ + 2e^- \rightarrow H_2$$

As a result, it has also been found that Cu is eluted by ionization to dissolve the inner layer (underlayer) copper pattern itself (see a principle shown in FIG. 8).

The invention is based on the above knowledges and lies in the following constructions.

That is, in order to solve the above problems, the multilayer printed circuit board according to the invention lies in (1) a build-up multilayer printed circuit board comprising an inner layer copper pattern having a finely uneven layer in its surface, an outer layer copper pattern and an interlaminar insulating layer formed therebetween, characterized in that a metal layer containing one or more metals having an ionization tendency not lower than that of copper but not higher than that of titanium is covered and formed on the surface of the uneven layer in the inner layer copper pattern; or (2) a build-up multilayer printed circuit board comprising an inner layer copper pattern having a finely uneven layer in its surface, an outer layer copper pattern and an interlaminar insulating layer formed therebetween, characterized in that a metal layer containing one or more metals having an ionization tendency not lower than that of copper but not higher than that of titanium is covered and formed on the surface of the uneven layer in the inner layer copper pattern and an opening portion for a viahole is formed on the interlaminar insulating layer to form a viahole connecting an inner layer conductor pattern to an outer layer conductor pattern through the metal layer and the uneven layer locally exposed at the opening portion.

In the multilayer printed circuit board described in the item (1) or (2), the metal having an ionization tendency not lower than that of copper but not higher than that of titanium is preferable to be at least one metal selected from the group consisting of titanium, aluminum, zinc, iron, indium, thallium, cobalt, nickel, tin, lead and bismuth. The fine uneven layer formed on the surface of the inner layer copper pattern is favorable to be a needle-shaped crystal alloy layer, and is particularly desirable to be needle-shaped copper-nickel alloy layer, copper-nickel-phosphorus alloy layer, copper-cobalt alloy layer or copper-cobalt-phosphorus alloy layer.

Furthermore, the metal layer containing one or more of the metals having the above ionization tendency is favorable to have a thickness thinner than that of the uneven layer. Particularly, it is desirable that the fine uneven layer on the inner layer copper pattern is a copper-nickel-phosphorus alloy layer having a thickness of 0.5–7.0 μm, while the metal layer containing one or more of the metals having the above ionization tendency is a tin layer having a thickness of 0.01–1.0 μm.

The other multilayer printed circuit board according to the invention lies in (3) a build-up multilayer printed circuit board comprising an inner layer copper pattern having a finely uneven layer in its surface, an outer layer copper pattern and an interlaminar insulating layer formed therebetween, characterized in that a noble metal layer is covered and formed on the surface of the uneven layer in the inner layer copper pattern; or (4) a build-up multilayer printed circuit board comprising an inner layer copper pattern having a finely uneven layer in its surface, an outer layer copper pattern and an interlaminar insulating layer formed therebetween, characterized in that a noble metal layer is covered and formed on the surface of the uneven layer in the inner layer copper pattern and an opening portion for a viahole is formed on the interlaminar insulating layer to form a viahole connecting an inner layer conductor pattern to an outer layer conductor pattern through the noble metal layer and the uneven layer locally exposed at the opening portion.

In the multilayer printed circuit board described in the item (3) or (4), the noble metal constituting the noble metal layer is preferable to be at least one of gold and platinum. The fine uneven layer formed on the surface of the inner layer copper pattern is favorable to be a needle-shaped crystal alloy layer, and is particularly desirable to be needle-shaped copper-nickel alloy layer, copper-nickel-phosphorus alloy layer, copper-cobalt alloy layer or copper-cobalt-phosphorus alloy layer. Furthermore, the noble metal layer is preferable to have a thickness thinner than that of the uneven layer.

The method of producing the multilayer printed circuit board according to the invention comprises (1) steps at least containing a step of forming a fine uneven layer on an upper surface of an inner layer copper pattern formed on a substrate; a step of covering and forming a metal layer containing one or more of metals having an ionization tendency not lower than that of copper but not higher than that of titanium on the surface of the uneven layer; a step of forming an interlaminar insulating layer comprised of an adhesive for electroless plating; a step of locally exposing the metal layer; a step of roughening the surface of the interlaminar insulating layer with a roughening solution; a step of applying a catalyst nucleus to the surface of the interlaminar insulating layer; and a step of forming an outer layer copper pattern and, if necessary, via-holes;

(2) steps at least containing a step of forming a needle-shaped copper-nickel-phosphorus alloy layer on an upper surface of an inner layer copper pattern formed on a substrate through an electroless copper-nickel-phosphorus alloy plating; a step of covering and forming a tin-containing played film on the surface of the copper-nickel-phosphorus alloy layer through an electroless substitution plating containing at least tin; a step of forming an interlaminar insulating layer comprised of an adhesive for electroless plating; a step of forming an opening portion for the formation of via-hole locally exposing the tin-containing plated film at given positions of the interlaminar insulating layer; a step of roughening the surface of the interlaminar insulating layer with a roughening solution; a step of applying a catalyst nucleus to the surface of the interlaminar insulating layer; and a step of forming an outer layer copper pattern and, if necessary, via-holes;

(3) steps at least containing a step of forming a fine uneven layer on an upper surface of an inner layer copper pattern formed on a substrate; a step of covering and forming a noble metal layer on the surface of the uneven layer; a step of forming an interlaminar insulating layer comprised of an adhesive for electroless plating; a step of locally exposing the noble metal layer; a step of roughening the surface of the interlaminar insulating layer with a roughening solution; a step of applying a catalyst nucleus to the surface of the interlaminar insulating layer; and a step of forming an outer layer copper pattern and, if necessary, via-holes.

Figure 1:
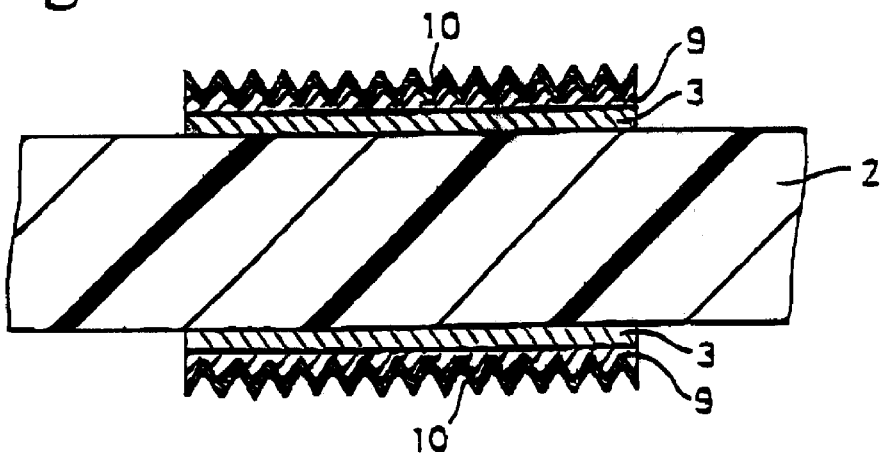
FIG. 1 is a partially sectional view illustrating a state of forming a copper-nickel-phosphorus layer and tin-containing plated film on an inner layer copper pattern in the method of producing the multilayer printed circuit board according to the invention.
Figure 2:
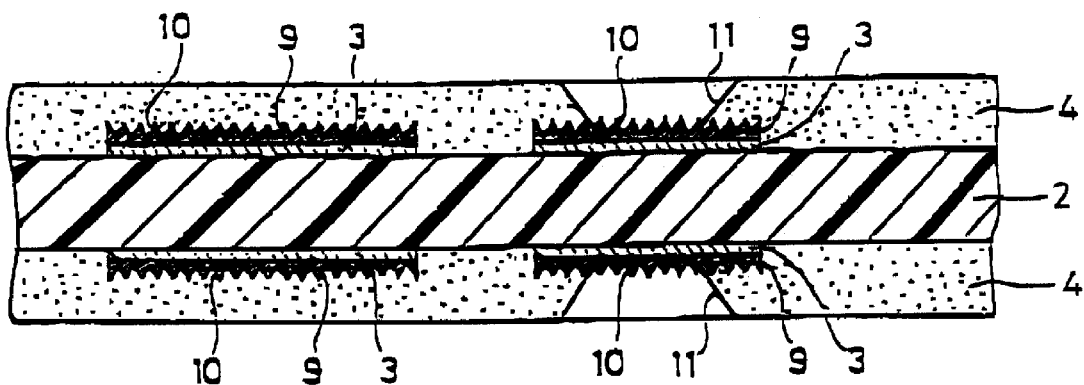
FIG. 2 is a partially sectional view illustrating a state of forming an opening for the formation of via-hole in an interlaminar insulating layer.
Figure 3:
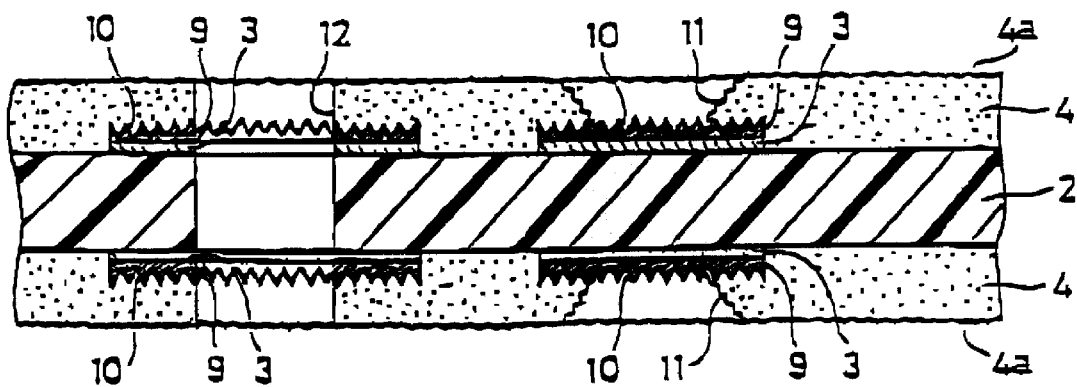
FIG. 3 is a partially sectional view illustrating a state of subjecting a roughening treatment after the formation of the opening for through-hole.
Figure 4:
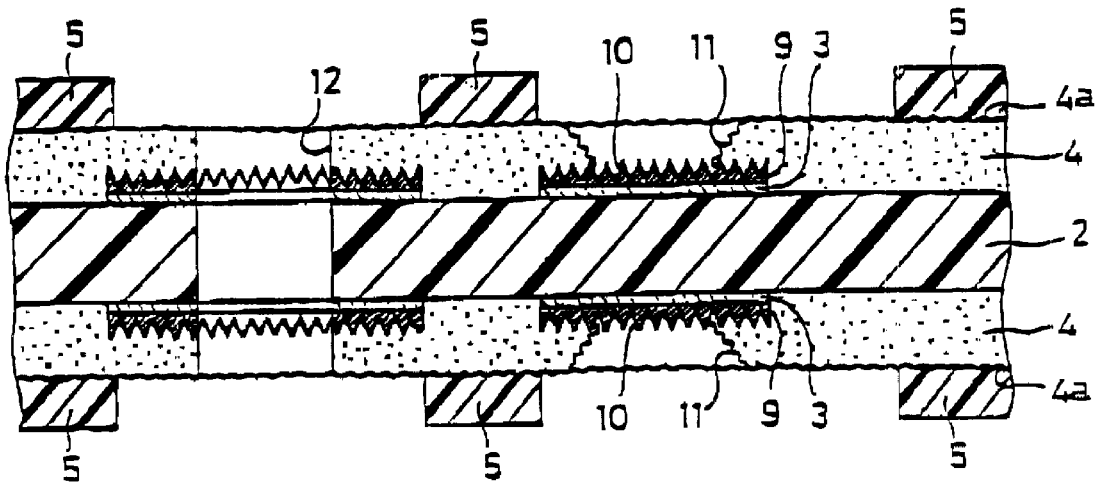
FIG. 4 is a partially sectional view illustrating a state of forming a resist for plating.

In these figures, numeral 1 is a (build-up) multilayer printed circuit board, numeral 2 a substrate, numeral 3 an inner layer copper pattern, numeral 4 an interlaminar insulating layer, numeral 5 a permanent resist as a resist for plating, numeral 6 an outer layer copper pattern, numeral 9 a copper-nickel-phosphorus layer as a fine uneven, numeral 10 a tin plated film as a tin-containing plated film, and numeral 11 an opening for the formation of via-hole.

DETAILED DESCRIPTION

The multilayer printed circuit board according to the invention lies in a point that the inner layer copper pattern provided at its surface with a fine uneven layer is protected with a metal layer containing one or more of metals having an ionization tendency not lower than that of copper but not higher than that of titanium, or a noble metal layer. Thus, there are provided the following merits:

① Since the inner layer copper pattern is not directly exposed to the acidic treating solution, the uneven layer portion made from the alloy is not dissolved.

② The metal layer containing one or more of metals having an ionization tendency not lower than that of copper but not higher than that of titanium is slightly dissolved in the acid to discharge electron, whereby the local cell reaction between Pd as a catalyst nucleus and Cu as a conductor circuit can be prevented to prevent the dissolution of Cu conductor circuit. On the other hand, in case of the noble metal layer, the acidic treating solution is not penetrated and the electrode reaction between Cu and Pd is not produced, whereby the dissolution of copper conductor circuit can be prevented.

③ The metal layer or noble metal layer is hardly colored even when it is exposed to the acidic treating solution, so that there is caused no poor appearance.

④ The metal layer or noble metal layer can prevent the oxidation of the uneven layer to improve the wettability between the uneven layer and the interlaminar insulating resin layer and also can prevent the occurrence of gap between the uneven layer and the interlaminar insulating resin layer to improve the adhesion property between the uneven layer and the resin layer and hence control the peeling of the resin layer or the occurrence of cracks even when being subjected to a heat cycle or the like. As a result, when the surface of the uneven layer is protected with the metal layer or noble metal layer, the copper pattern provided with the uneven layer is possible to be left to stand for about 2 weeks, so that the maintenance of the steps becomes easy.

⑤ In case of forming the via-hole, it has hitherto been required to remove the oxide film by the acid treatment prior to the electroless copper pleating on the uneven layer. In the invention, the acid treatment is useless because the metal layer or noble metal layer has an electric conductivity without being oxidized.

Such functions and effects are particularly conspicuous in the multilayer printed circuit boards having the inner layer copper pattern provided with the uneven layer comprised of an alloy film, which is apt to cause color change or dissolution with acid or oxidizing agent and is easy to cause oxidation and lowers the affinity with the resin to result in the peeling or cracks once the oxidation is caused, such as copper-nickel alloy film, copper-nickel-phosphorus alloy film, copper-cobalt alloy film or copper-cobalt-phosphorus alloy film.

In the invention, it is desirable that the metal having an ionization tendency not lower than that of copper but not higher than that of titanium is selected from the group consisting of titanium, aluminum, zinc, iron, indium, thallium, cobalt, nickel, tin, lead and bismuth.

Among them, tin is an industrially cheap metal having a less toxicity, which is not colored with the acid or oxidizing agent and may continue the maintenance of gloss and precipitates by substitution reaction with copper and is optimum in a point that it can cover the needle crystal of copper-nickel layer or copper-nickel-phosphorus layer without breaking such a layer.

Since tin is precipitated by the substitution reaction with copper, once it is substituted with copper in the surface layer, the substitution reaction is completed and hence a very thin layer of tin is formed so as to cover the needle crystal of the uneven layer. Therefore, the needle crystal of the uneven layer is maintained at a state of sharp shape as it is, so that the adhesion property between the uneven layer and tin plated film is excellent.

In the invention, the noble metal constituting the noble metal layer is desirable to be gold or platinum. These noble metals are hardly attacked with the acid or oxidizing agent as a roughening solution as compared with silver or the like and can easily cover the uneven layer. However, the noble metal is expensive in the coat, so that it is frequently used only for high value-added products.

In the invention, the fine uneven layer on the surface of the inner layer copper pattern is desirable to be a needle-shaped crystal alloy layer and is particularly desirable to be the needle-shaped copper-nickel alloy layer, copper-nickel-phosphorus alloy layer, copper-cobalt alloy layer or copper-cobalt-phosphorus alloy layer.

These alloy layers are excellent in the adhesion property to the interlaminar insulating layer of the needle crystal and the electrical conductivity, so that if the alloy layer is formed on the via-hole, it is not insulated and is not necessary to be removed for the formation of the via-hole. Therefore, the production steps are simplified and the occurrence of rejects can largely be reduced.

Further, the alloy layer is high in the hardness and excellent in the heat cycle property.

The contents of copper, nickel and phosphorus constituting the alloy layer are desirable to be about 90–96 wt %, 1–5 wt % and 0.5–2 wt %, respectively. Because, the crystal of the precipitated film is rendered into the needle structure to develop the excellent anchor effect within the above range.

According to the invention, the metal layer containing one or more of metals having the ionization tendency not lower than that of copper but not higher than that of titanium, or the noble metal layer is desirable to have a thickness thinner than that of the uneven layer. When the thickness of the metal layer or the noble metal layer is thicker than that of the uneven layer, the uneven layer is deeply embedded under the metal layer or the like. In the latter case, the sharp shape of the needle crystal is not maintained (i.e. the top portion of the sharp needle crystal is obtused) and the desired adhesion property can not be ensured.

① The uneven layer on the surface of the inner layer copper pattern is a copper-nickel-phosphorus alloy layer having a thickness of 0.5–7.0 μm, preferably 1.0–5.0 μm, more particularly 1.5–3.0 μm. Moreover, the thickness of the uneven layer (copper-nickel-phosphorus alloy layer) used herein means a distance ranging from the surface of the inner layer copper pattern to a top of the needle-shaped crystal.

The reason why the thickness of the uneven layer is restricted to the above range is due to the fact that when the thickness of the uneven layer is thicker than 7.0 μm, there is a fear of increasing the production cost and material cost accompanied with the prolonging of the plating time and also the plated film itself becomes brittle to cause the peeling from the interlaminar insulating layer. On the other hand, when it is thinner than 0.5 μm, the anchor effect is insufficient and the peeling from the interlaminar insulating layer is apt to be caused.

② The metal layer containing one or more of metals having an ionization tendency not lower than that of copper but not higher than that of titanium is a tin-containing plated layer having a thickness of 0.01–1.0 μm, preferably 0.05–0.8 μm, more particularly 0.1–0.5 μm.

The reason why the thickness of the tin-containing plated layer (metal layer) is restricted to the above range is due to the fact that when the tin plated layer is thicker than 1.0 μm, the desired adhesion property to the interlaminar resin insulating layer can not be ensured and also the production cost and material cost are undesirably increased. On the other hand, when the tin plated layer is thinner than 0.01 μm, it can not completely cover the copper-nickel-phosphorus alloy layer and hence the uncovered alloy portion is directly exposed to chromic acid or the like and dissolved therein not to prevent the electrode reaction.

③ The noble metal layer is desirable to have a thickness of 0.05–1.0 μm. Because, when the thickness of the noble metal layer exceeds 1.0 μm, the cost is increased and also the uneven layer on the surface of the inner layer copper pattern is embedded and hence the desired adhesion property to the interlaminar resin insulating layer can not be ensured, while when the thickness of the noble metal layer is less than 0.05 μm, the protection of the uneven layer is difficult and the electrode reaction can not be prevented.

In the invention, it is desirable that a preservative is applied onto the surface of the metal layer having an ionization tendency not lower than that of copper but not higher than that of titanium, or the noble metal layer.

Particularly, when the metal layer having an ionization tendency not lower than that of copper but not higher than that of titanium is formed by substitution-plating or the like, it is a porous metal layer having fine pores. Therefore, when the substrate provided with such a metal layer is exposed under conditions of high temperature, high pressure and high humidity, the copper pattern or copper-nickel (-phosphorus) needle-shaped crystal layer is corroded through the fine pores to form gaps. These gaps can be observed by looking through the thin film of the metal layer (e.g. tin-substituted layer or the like), and the gap portion is discolored to cause a poor appearance.

In order to prevent the occurrence of gap through corrosion, the preservative is applied onto the surface of the metal layer or the surface of the noble metal layer. In this case, the preservative adheres to the fine pores in the porous metal layer and acts to shut off the influence upon the copper pattern or the copper-nickel (-phosphorus) needle-shaped crystal layer from external. As a result, the humidity absorption of the porous metal layer (e.g. tin-substituted layer or the like) can be prevented, and it is possible to prevent the contact of the copper pattern or copper-nickel (-phosphorus) needle-shaped crystal layer with air. Further, it is considered that the preservative obstructs the local cell reaction of the copper pattern or copper-nickel (-phosphorus) needle-shaped crystal layer to prevent the promotion of corrosion thereof.

As the preservative, 1,2,3-benzotriazole (chemical formula 1), tolyltriazole (chemical formula 2) or derivatives thereof is desirable. The derivatives used herein are a group of compounds obtained by bonding an alkyl group such as methyl group, ethyl group or the like, or carboxyl group, amino group, hydroxyl group or the like to benzene ring of the chemical formulae 1 and 2.

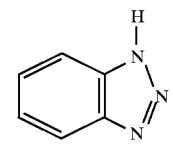

Chemical formula 1

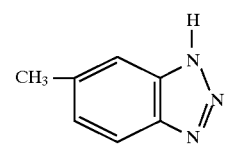

Chemical formula 2

These compounds are excellent in the anti-corrosive effect of copper and easily dissolve in a solvent during the light exposure and development treatment of an interlaminar adhesive, so that they do not remain on an inner layer pad exposed to an opening for the formation of via-hole. As a result, even if the via-hole is formed on the inner layer pad, the insulation is not formed between the via-hole and the inner layer pad to ensure current conducting and hence these compounds are particularly suitable to printed circuit boards having the via-holes therein.

Even after the multi-layer printed circuit board obtained by applying the preservative as mentioned above is subjected to PCT test (Pressure Cooker Test) for 200 hours, the color change of the pattern is not observed. Moreover, the "Pressure Cooker" in the PCT test is a pressure cooker for testing the degradation of properties in a product exposed under conditions of high temperature, high pressure and high humidity.

In the invention, the interlaminar insulating layer constituting the multilayer printed circuit board is desirable to be made from an adhesive for electroless plating. Particularly, the adhesive for electroless plating is desired to contain previously cured heat-resistant resin particles soluble in acid or oxidizing agent into heat-resistant resin (heat-resistant resin matrix) hardly soluble in acid or oxidizing agent.

It is desired that the heat-resistant resin particles are selected from ① heat-resistant resin powder having an average particle size of not more than 10 μm, ② aggregated particles formed by aggregating heat-resistant resin powder having an average particle size of not more than 2 μm so as to indicate an average particle size of not less than 3 times of the above powder, ③ a mixture of heat-resistant resin powder having an average particle size of not more than 10 μm and heat-resistant resin powder having an average particle size of not more than 1/5 of the above powder and not more than 2 μm, and ④ false particles formed by adhering at least one of heat-resistant resin powder having an average particle size of not more than 2 μm and inorganic powder onto surface of heat-resistant resin powder of having an average particle size of 2–10 μm.

As the heat-resistant resin matrix, a photosensitive resin may advantageously be used because the opening portion for the formation of the via-hole may easily be formed by light-exposure and development. Furthermore, thermosetting resins such as epoxy resin, polyimide resin, epoxyacrylate resin and the like, or a composite formed by mixing this resin with a thermoplastic resin such as polyether sulfone or the like may be used.

The heat-resistant resin particles are made from epoxy resin, amino resin (melamine resin, urea resin, guanamine resin) or the like.

Moreover, the solubility of the epoxy resin to acid or oxidizing agent may optionally be changed by varying the kind of oligomer, kind of curing agent and crosslinking density. For instance, when bisphenol A-type epoxy resin oligomer is cured with an amine series curing agent, the resulting product is easily soluble in the oxidizing agent. When novolac epoxy resin oligomer is cured with an imidazole series curing agent, the product is hardly soluble in the oxidizing agent.

As the acid for dissolving and removing the heat-resistant resin particles, there are phosphoric acid, hydrochloric acid, sulfuric acid, organic acids (formic acid, acetic acid and the like) and so on. Particularly, the organic acids are desirable because the remaining ion is less and the migration hardly occurs, and also the corrosion of inner layer conductor circuit hardly occurs.

As the oxidizing agent, chromic acid, permanganate (potassium permanganate or the like) and so on are desirable.

Particularly, when amino resin particles are dissolved and removed, they are desirable to be alternatively subjected to a roughening treatment with acid and oxidizing agent.

In the invention, it is required to apply a palladium catalyst prior to the copper-nickel alloy plating to copper-nickel-phosphorus alloy plating because the plating precipitation is first attained by the application of the catalyst.

As the catalyst, use may be made of a mixed solution of palladium chloride catalyst and an organic acid. The local electrode reaction between copper and palladium is caused by the presence of the palladium catalyst, so that the invention is to prevent the local electrode reaction.

The production of the multilayer printed circuit board according to the invention will be described below.

(1) At first, the inner layer copper pattern is formed on the substrate.

The formation of copper pattern on the substrate is carried out by etching a laminate plate lined with copper, or there is a method wherein the adhesive layer for electroless plating is formed on the substrate such as glass-epoxy substrate, polyimide substrate, ceramic substrate, metal substrate or the like, and the surface of the adhesive layer is roughened to form a roughened surface and then this surface is subjected to electroless plating.

(2) Then, the fine uneven layer is formed on the upper surface of the inner layer copper pattern provided on the substrate.

As the uneven layer, there are needle-shaped crystal layer of alloy obtained by electroless copper-nickel plating, electroless copper-nickel-phosphorus plating, electroless copper-cobalt plating, electroless copper-cobalt-phosphorus plating or the like (needle-shaped crystal alloy plated layer), black oxide layer obtained by oxidation treatment of copper, black oxide reduction layer obtained by oxidation and reduction treatments of copper, physically roughened layer obtained by physical method such as sand blast, shot blast, buffing, wrapping or the like, and so on. Among them, the needle-shaped crystal layer of the alloy obtained by electroless copper-nickel plating, electroless copper-nickel-phosphorus plating or the like (needle-shaped crystal alloy plated layer) is desirable. Sine such an alloy layer is a needle-shaped crystal layer, the adhesion property to the resin insulating layer is excellent and the electrical conductivity is excellent, so that it is not necessary to remove the alloy layer in the formation of the via-hole. Furthermore, the alloy layer can easily be formed by electroless plating, so that the damage to the substrate can be reduced.

The composition for the electroless plating forming the needle-shaped crystal layer of the alloy, for example, electroless copper-nickel-phosphorus plating is desirable to have copper sulfate: 1–40 g/l, nickel sulfate: 0.1–6.0 g/l, citric acid: 10–20 g/l, hypophosphite: 10–100 g/l, boric acid: 10–40 g/l and surfactant: 0.01–10 g/l. Particularly, the presence of the surfactant is necessary for the formation of the needle-shaped crystal layer and should satisfy the above range. When the amount of the surfactant is outside the above range, the plated uneven layer is not dense and hence the heat cycle property is considerably degraded.

As the conditions for electroless plating, it is desirable that a temperature of a plating bath is 60°–80° C., pH is a strong basicity of about 8.5–10, a bath ratio is 0.01–1.0 $dm^2/l$, a deposition rate is 1–3 μm/10 min and a plating time is 5–20 minutes.

Particularly, in order to form the uneven layer (needle-shaped crystal layer) by alloy plating treatment in the method according to the invention, it is desirable that the distance from the surface of the plating solution to the upper end of the substrate to be treated is held to be not less than 100 mm. Because, hydrogen gas generated by the plating reaction remains in the surface of the plating solution, so that when the substrate is held at a position corresponding to less than 100 mm of the distance from the plating solution surface, bubbles of hydrogen gas adhere to the substrate and hence the contact of the substrate with the plating solution at the adhered portion is obstructed and the plated layer may not be deposited. Thus, the influence of $H_2$ gas remaining on the plating solution surface is obstructed and hence the electroless plating can be carried out without unevenness.

(3) After the formation of the uneven layer at the above step (2), the metal layer containing one or more of metals having an ionization tendency not lower than that of copper but not higher than that of titanium, or the noble metal layer is formed on the uneven layer.

The formation of this layer protects the uneven layer formed on the surface of the inner layer copper pattern and car control the local electrode reaction between Pd and Cu.

The metal having the ionization tendency not lower than that of copper but not higher than that of titanium is desirable to be at least one of titanium, aluminum, zinc, iron, indium, thallium, cobalt, nickel, tin, lead and bismuth. Among these metals, indium, lead, cobalt and tin are filmed by electroless plating, while the other metals are filmed by sputtering, evaporation or the like.

Particularly, tin can be precipitated by electroless substituted plating and formed as a thin film and is excellent in the adhesion property to the uneven layer, so that it can most advantageously be utilized.

As the electroless plating bath for the formation of the tin-containing plated film uses the tin borofluoride-thiourea solution or tin chloride-thiourea solution and is desirable to have plating conditions that the plating is conducted at room temperature of about 20° C. for about 5 minutes or at a high temperature of about 50°–60° C. for about 1 minute. According to such an electroless plating treatment, Cu—Sn substitution reaction is generated on the surface of the copper pattern based on the formation of metal complex of thiourea to form a thin Sn film layer having a thickness of 0.1–2 µm. Owing to Cu, Sn substitution reaction, the uneven layer can be covered without breaking the shape of the uneven layer.

The noble metal layer can be used instead of the metal layer containing one or more of metals having an ionization tendency not lower than that of copper but not higher than that of titanium.

The noble metal constituting the noble metal layer is desirable to be gold or platinum. These noble metals are hardly attacked by acid or oxidizing agent as a roughening solution as compared with silver or the like and can easily cover the uneven layer. However, the noble metal is high in the cost and is frequently used in only high value-added products.

The film of gold or platinum can be formed by sputtering, electrolysis or electroless plating.

(4) The interlaminar insulating layer made from an adhesive for electroless plating is formed on the inner layer copper pattern subjected to the treatment of the item (3).

The adhesive for electroless plating is desirable to contain previously cured heat-resistant resin particles soluble in acid or oxidizing agent in heat-resistant resin hardly soluble in acid or oxidizing agent (heat-resistant resin matrix)., which is applied or laminated in form of film to form an interlaminar insulating layer.

(5) A part of the interlaminar insulating layer formed in the item (4) is removed to expose a part of the metal layer containing one or more of metals having an ionization tendency not lower than that of copper but not higher than that of titanium, or the noble metal layer, whereby an opening for the formation of the via-hole is formed. Moreover, when the via-hole is not formed, the above removal and the formation of the opening are not conducted.

The formation of the opening is carried out by light exposure and development in case of using the photosensitive resin as a heat-resistant resin matrix for the adhesive, or by piercing through laser or the like in case of using thermosetting resin and/or thermoplastic resin as a heat-resistant resin matrix for the adhesive.

(6) The surface of the interlaminar insulating layer (adhesive layer for electroless plating) formed in the item (5) is roughened with a roughening solution.

The roughening is carried out by dissolving and removing the heat-resistant resin particles in the adhesive constituting the interlaminar insulating layer to form octopus-trap shaped anchors. The roughening solution used for such a roughening is favorable to be acid or oxidizing agent. Particularly, when amino resin particles are used as the heat-resistant resin particles, it is desired to alternately conduct the roughening treatment with acid such as phosphoric acid or the like and the oxidizing agent such as permanganate or the like. That is, the resin matrix is slightly dissolved with the oxidizing agent to expose amino resin particles and then these exposed amino resin particles are hydrolyzed and dissolved and removed with acid to form anchors.

Moreover, in case of forming the through-hole, a given portion after the completion of the roughening treatment is pierced by drilling, punching or the like to form a hole for the formation of the through-hole. In this case, a part of the metal layer or the noble metal layer is also exposed.

(7) A catalyst nucleus is applied onto the thus formed rough surface of the interlaminar insulating layer and inner wall faces of the opening for the formation of the via-hole and the hole for the formation of the through-hole, and then the plating resist is applied or a film of plating resist is laminated, which is subjected to light exposure and development to form a plating resist pattern.

Next, an upper layer copper pattern, via-hole and through-hole are formed by electroless plating to produce a build-up multilayer printed circuit board.

(8) As a pretreatment for the electroless plating at the step (2), the substrate provided with the inner layer copper pattern at the step (1) is degreased, and subjected to a soft etching treatment and then subjected to application and activation of palladium catalyst for the electroless copper-nickel-phosphorus alloy plating treatment.

In the method according to the invention, it is particularly desirable that an oxygen concentration dissolved in a bath at the washing with water followed by the soft etching treatment is controlled to not more than 1.0 ppm, preferably by an inert gas bubbling in the pretreatment step for the electroless plating. Thus, the surface oxidation of the etched underlayer copper conductor is controlled and hence the subsequent catalyst application and electroless plating can evenly be conducted. That is, when oxygen of more than 1.0 ppm is existent in the water washing bath, the surface of copper pattern is oxidized and hence the plated alloy is not deposited.

In this case, the inert gas bubbling is effective to control the amount of dissolved oxygen in the water washing bath to not more than 1.0 ppm while maintaining the washing force. For example, nitrogen gas, argon gas and the like can be used.

Moreover, the soft etching treatment means a chemical polishing for forming a roughened surface having no directionality to remove off the oxide film from the surface to thereby provide an active metal surface. A chemical used in the soft etching treatment is oxides the surface of metallic copper through its oxidation force and then dissolves the oxidized copper into the chemical as a copper ion. That is, the chemical is a solution having a function as an oxidizing agent for copper and a function for dissolving copper oxide. As the soft etching agent, there are the followings ① and ②.

① Persulfate system

It is an aqueous solution consisting essentially of ammonium persulfate, sodium persulfate, potassium persulfate or the like. Concretely, it is a mixed solution of 10–200 g/l aqueous sodium persulfate solution and 10–100 ml/l sulfuric acid.

② Hydrogen peroxide/sulfuric acid system

It is a mixed solution of hydrogen peroxide and sulfuric acid.

Furthermore, a mixed solution of palladium chloride catalyst and organic acid can be used as the palladium catalyst.

EMBODIMENTS

The following examples will be described with reference to FIGS. 1–5.

Figure 5:
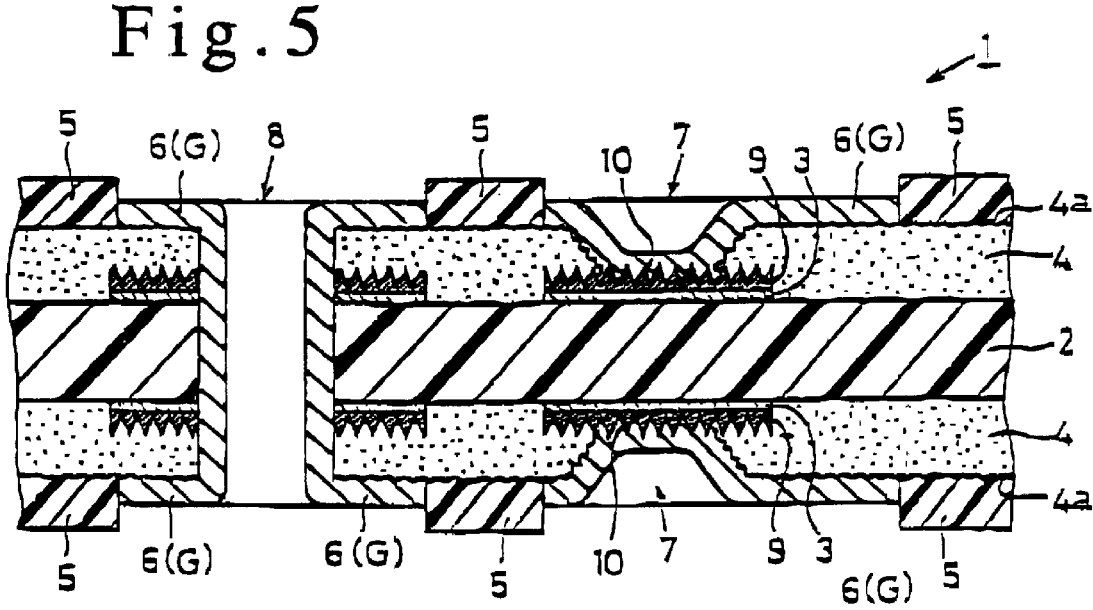
FIG. 5 is a partially sectional view illustrating a state of conducting an electroless plating.

FIG. 5 is a partial section view of a build-up multilayer printed circuit board 1 produced by the following example. As shown in FIG. 5, so-called four-layer type multilayer printed circuit board 1 having four conductor layers is produced in the following example. That is, an inner layer copper pattern 3 provided at its surface with a fine uneven layer 9 is formed on each surface of a substrate 2 constituting the multilayer printed circuit board 1, and an interlaminar insulating layer 4 is formed on each surface of the substrate 2 provided with he inner layer copper pattern 3. Further, a permanent resist 5 as a plating resist and an outer layer copper pattern 6 are formed on an upper surface of the interlaminar insulating layer 4, in which the outer layer copper pattern 6 is electrically connected to the inner layer copper pattern 3 through a via-hole 7 and a through-hole 8.

Particularly, in the multilayer printed circuit board 1 of the example according to the invention, a metal layer 10 containing one or more of metals having an ionization tendency not lower than that of copper but not higher than that of titanium or a noble metal layer 10 is formed for protecting the fine uneven layer (needle-shaped copper-nickel layer or copper-nickel-phosphorus layer) 9 formed on the surface of the inner layer copper pattern 3.

EXAMPLE 1

(1) A laminate plate formed by laminating copper foil on both surfaces of the substrate 2 is used as a starting material and then the copper foil is etch ed in form of a pattern according to usual manner to form the inner layer copper pattern 3 on each surface of the substrate 2. Particularly, a glass-epoxy plate is used as the substrate 2 in this example.

(2) The substrate is subjected to an acidic degreasing and soft etching treatment with a soft etching agent consisting essentially of a mixed solution of 100 g/l aqueous sodium persulfate solution and 50 ml/l sulfuric acid, washed with 10% sulfuric acid, and treated with a catalyst solution comprising palladium chloride and organic acid to conduct activation for the application of Pd catalyst. Thereafter, the treated substrate is subjected to a plating with an electroless plating bath having a composition shown in the following table to form the uneven layer (roughening layer of needle-shaped crystal) 9 of Ni—P—Cu alloy having a thickness of 2.5 µm on the surface of the copper pattern and via-hole pad.

In this example, the bubbling of $N_2$ gas (or Ar gas is applicable) is especially carried out at the time of water washing before the alloy plating after the soft etching treatment. Thus, the oxygen concentration dissolved in the water washing bath at the stage of pretreatment for electroless plating is controlled to not more than 1.0 ppm. Concretely, the oxygen concentration is 0.77 ppm as measured by means of a dissolved oxygen meter (Model: M-26074) made by Orbisfare Laboratories (Swiss).

| Electroless plating bath (Cu-Ni-P) | |
| --- | --- |
| Copper sulfate; | 8.0 g/l |
| Nickel sulfate; | 0.6 g/l |
| Citric acid; | 15.0 g/l |
| Sodium hypophosphite; | 29.0 g/l |
| Boric acid; | 31.0 g/l |
| Surfactant; | 0.1 g/l |
| pH | 9.0 |

In this example, "Inter Plate Process" as a tread name, made by Ebara Udyllte Co., Ltd., is particularly used as the plating bath for the formation of Cu—Ni—P alloy roughened layer 9. The treating conditions are 70° C. and 10 minutes.

Further, the Cu—Ni—P alloy plating treatment in this example is carried out so as to control the distance from the plating solution surface to the upper end of the substrate to be treated to a position of 130 mm.

Moreover, Cu—Ni plating bath can be used as the plating bath of the roughened layer 9 in this example.

(3) After the washing with water (and drying, if necessary), the substrate is immersed in an electroless tin plating bath comprising tin borofluoride-thiourea solution (or tin chloride-thiourea solution) at 50° C. for 1 minute to substitution-form a tin plated layer 10 having a thickness of 0.3 µm on the surface of Cu—Ni—P alloy roughened layer 9 (see FIG. 1). After this treatment, the substrate is left to stand for 24 hours and immersed in water, and as a result it has been confirmed that water repelling phenomenon is not observed and oxide film is not formed on the surface of the substrate.

Since the electroless tin plating is a substitution reaction, once the surface of the Cu—Ni—P layer 9 is substituted with plated tin, the plating reaction is not progressed, so that the very thin tin plated layer 10 can be formed. Further, the adhesion property between the Cu—Ni—P layer 9 and the tin plated layer 10 is excellent owing to the substitution reaction.

| Substitution Plating (tin) | |
| --- | --- |
| Tin borofluoride; | 0.1 mol/l |
| Thiourea; | 1.0 mol/l |
| Temperature; | 50° C. |
| pH; | 1.2 |

(4) On the other hand, a mixture of 70 parts by weight of 25% acrylated product of cresol novolac type epoxy resin (made by Nippon Kayaku Co., Ltd., molecular weight: 2500) dissolved in DMDG (dimethylglycol dimethyl ether), 30 parts by weight of polyether sulphone (PES), 4 parts by weight of an imidazole curing agent (made by Shikoku Kasei Co., Ltd., trade name: 2E4MZ-CN), 10 parts by weight of caprolactone-modified tris(acroxyethyl) isocyanurate (made by Toa Gosei Co., Ltd., trade name: Aronix M325) as a photosensitive monomer, 5 parts by weight of benzophenone (made by Kanto Kagaku Co., Ltd.) as a photoinitiator and 0.5 part by weight of Michelor ketone (made by Kanto Kagaku Co., Ltd.) as a photosensitizer is mixed with 35 parts by weight of melamine resin particles having an average particle size of 5.5 µm and 5 parts by weight of the melamine resin particles having an average particle size of 0.5 µm and further added with NMP, which is adjusted to a viscosity of 2000 cps in a homodisper stirring machine and then kneaded through three rolls kneader to obtain a photosensitive adhesive solution.

(5) The above photosensitive adhesive solution is applied to both surfaces of the substrate 2 washed with water and dried after the above steps (1)–(3) through a roll coater, left to stand at a horizontal state for 20 minutes and then dried at 60° C. for 0.5 hour to form an adhesive layer 4 having a thickness of 40 µm.

(6) A photomask film printed with black circles of 100 µm in diameter is closed onto the printed board after the treatment of the item (5) and exposed to a super-high pressure mercury lamp at 500 mj/cm². This board is developed by spraying DMDG solution to form openings as a via-hole of 100 µm in diameter on the board. Further, the board is exposed to a super-high pressure mercury lamp at about 6000 mj/cm² and heated at 100° C. for 1 hour and then at 150° C. for 12 hours to form the interlaminar resin insulating layer 4 having a thickness of 50 µm and containing openings (openings 11 for the formation of via-hole) corresponding to the photomask film with an excellent size precision (see FIG. 2). Moreover, the opening 11 for the formation of via-hole is formed so as to partly expose the tin plated film 10.

(7) The board treated in the step (6) is immersed in potassium permanganate adjusted to pH=13 (KMnO$_4$, 60 g/l) at 70° C. for 2 minutes and then immersed in phosphoric acid for 30 minutes to form a roughened surface 4a of the interlaminar resin insulating layer, which is then immersed in a neutral solution (made by Atotech Co., Ltd.) and washed with water. Thereafter, the board is subjected to drilling or punching to form holes 12 for the formation of through-hole on given portions of the substrate 2 (see FIG. 3). Moreover, it is subjected to desmia treatment, if necessary.

(8) A palladium catalyst (made by Atotech Co., Ltd.) is applied to the board treated in the step (7) to form a catalyst nucleus on the surface of the interlaminar insulating layer 4 and the inner wall surfaces of the opening 11 for the formation of via-hole and the hole 12 for the formation of through-hole.

(9) On the other hand, a photosensitivity imparting oligomer (molecular weight: 4000) of cresol novolac epoxy resin (made by Nippon Kayaku Co., Ltd., trade name: ECCN-103S) acrylated with 25% epoxy group dissolved in DMDG, PES (molecular weight: 17000), imidazole curing agent (made by Shikoku Kasei Co., Ltd., trade name: 2PMHZ-PW), acrylated isocyanate as a photosensitive monomer (made by Toa Gosei Co., Ltd., trade name: Aronix M215), benzophenone as a photoinitiator (made by Kanto Kagaku Co., Ltd.) and Michelor ketone a photosensitizer (made by Kanto Kagaku Co., Ltd.) are mixed according to the following composition with NMP, which is adjusted to a viscosity of 3000 cps in a homodisper stirring machine and kneaded through three rolls kneader to obtain a liquid resist. Resin composition: photosensitive epoxy/PES/M215/BP/MK/imidazo le=70/30/10/5/0.5/5

(10) The above liquid resist is applied onto the resin insulating layer of the board treated in the above item. (8) through a roll coater and dried at 80° C. for 0.5 hour to form a resist layer having a thickness of about 30 μm. Then, a mask film drawn with a conductor circuit pattern of L/S= 50/50 μm is closed to the resist layer and exposed to a super-high pressure mercury lamp at 1000 mJ/cm$^2$ and developed by spraying DMDG to form a plating resist removing a portion corresponding to the conductor circuit pattern on the board. Furthermore, it is exposed to a super-high pressure mercury lamp at 3000 mJ/cm$^2$ and heated at 100° C. for 1 hour and further at 150° C. for 3 hours to form a permanent resist 5 on the surface of the interlaminar insulating layer 4 (see FIG. 4).

(11) The board treated in the item (10) is previously subjected to a preplating treatment (concretely treatment with sulfuric acid or the like and activation of catalyst nucleus) and thereafter subjected to an electroless plating in an electroless copper plating bath having the following composition, whereby electroless copper plated film G having a thickness of 15 μm is precipitated on the no-resist formed portion to form outer layer copper pattern 6, via-hole 7 and through-hole 8, whereby the build-up multilayer printed circuit board 1 is produced (see FIG. 5).

| Composition of electroless plating bath | |
|---|---|
| Copper sulfate; | 0.06 mol/l |
| Formalin; | 0.30 mol/l |
| Sodium hydroxide; | 0.35 mol/l |
| EDTA; | 0.35 mol/l |
| Additive; | small |
| Temperature; | 70–72° C. |
| pH; | 12.4 |

As mentioned above, the Cu—Ni—P layer 9 can be protected by the tin plated film 10 having an acid resistance according to this example in which the tin plated film 10 is substitution-formed on the surface of the Cu—Ni—P layer 9 through the electroless tin plating bath. Thus, the Cu—Ni—P layer 9 being weak in the acidic treating solution is not directly exposed to chromic acid, soft etching solution or the like, so that the dissolution of Cu in the surface layer can surely be prevented. Furthermore, the color of the tin plated film 10 itself is not changed even in the direct exposure to the acidic treating solution, so that the degradation of the appearance in the multilayer printed circuit board 1 can surely be prevented. And also, the desired adhesion property is ensured between the inner layer copper pattern 3 and the interlaminar insulating layer 4, so that the reliability can be improved.

Figure 6:
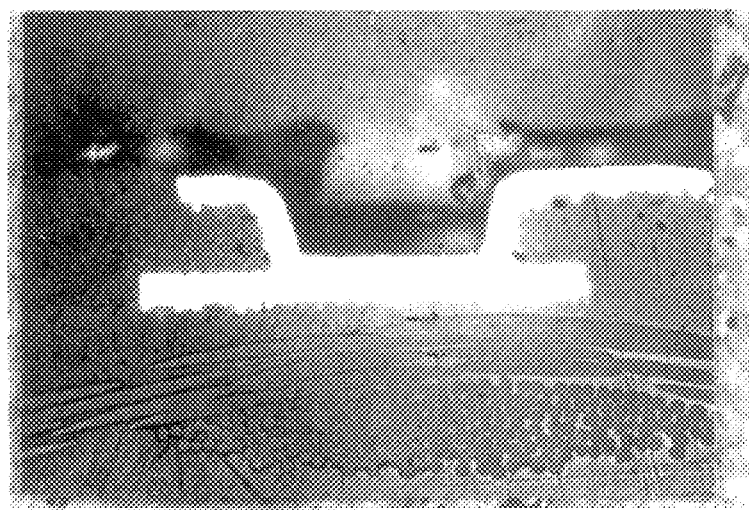
FIG. 6 is a microphotograph showing a sectional structure of a pattern formed on a substrate in the multilayer printed circuit board according to the invention.

Moreover, as seen from microphotograph of FIG. 6 showing a sectional structure of the via-hole portion, the copper pattern constituting the multilayer printed circuit board according to the invention has no dissolved portion and forms a good via-hole.

EXAMPLE 2

In this example, the build-up multilayer printed circuit board is produced in the same manner as in Example 1 except that the surface of the Cu—Ni—P alloy roughened layer 9 is subjected to a substitution plating treatment with indium instead of the substitution formation of the tin plated layer 10.

Moreover, the plating treatment is carried out by using a cyanide bath containing 12 g/l of indium under conditions of plating temperature; 30°–50° C., pH; 1.2 and plating time; 20 minutes, whereby the indium film having a thickness of 1 μm is formed.

EXAMPLE 3

In this example, the build-up multilayer printed circuit board is produced inn the same manner as in Example 1 except that the surface of the Cu—Ni—P alloy roughened layer 9 is subjected to a substitution plating treatment with lead instead of the substitution formation of the tin plated layer 10.

Moreover, the plating treatment is carried out by using a plating bath of the following composition under conditions of plating temperature; 50° C., pH; 1.5 and plating time; 20 minutes, whereby the lead film having a thickness of 0.5 μm is formed.

| | |
|---|---|
| Lead tetrafluoroborate; | 0.1 mol/l |
| Hydrogen borofluoride; | 1.0 mol/l |
| Temperature; | 50° C. |
| pH; | 1.5 |

EXAMPLE 4

In this example, the build-up multilayer printed circuit board is produced inn the same manner as in Example 1 except that the surface of the Cu—Ni—P alloy roughened layer 9 is subjected to a substitution plating treatment with cobalt instead of the substitution formation of the tin plated layer 10.

Moreover, the plating treatment is carried out by using a mixed plating bath containing cobalt chloride and sodium hypophosphite under conditions of plating temperature; 75° C., pH; 7.0 and plating time; 20 minutes, whereby the indium film having a thickness of 1.0 μm is formed.

EXAMPLE 5

In this example, the build-up multilayer printed circuit board is produced inn the same manner as in Example 1 except that the surface of the Cu—Ni—P alloy roughened layer 9 is subjected to a substitution plating treatment with nickel instead of the substitution formation of the tin plated layer 10.

Moreover, the plating treatment is carried out by using a plating bath containing nickel sulfate and sodium hypophosphite under conditions of plating temperature; 80° C., pH; 4 and plating time; 20 minutes, whereby the indium film having a thickness of 1.0 μm is formed.

EXAMPLE 6

In this example, the build-up multilayer printed circuit board is produced inn the same manner as in Example 1 except that the surface of the Cu—Ni—P alloy roughened layer 9 is subjected to an electrolytic plating treatment with zinc instead of the substitution formation of the tin plated layer 10 to form zinc film having a thickness of 1.0 μm.

EXAMPLE 7

In this example, the build-up multilayer printed circuit board is produced in the same manner as in Example 1 except that the surface of the Cu—Ni—P alloy roughened layer 9 is subjected to a sputtering treatment with titanium, aluminum, iron, thallium or bismuth instead of the substitution formation of the tin plated layer 10 to form a film having a thickness of 0.8 μm.

EXAMPLE 8

In this example, the build-up multilayer printed circuit board is produced in the same manner as in Example 1 except that the surface of the Cu—Ni—P alloy roughened layer 9 is subjected to a plating treatment with gold instead of the substitution formation of the tin plated layer 10.

Moreover, the plating treatment is an electrolytic plating using a plating bath composed mainly of gold potassium cyanide, and the gold plated film having a thickness of 0.5 μm is formed.

In the multilayer printed circuit board of this example, the surface of the uneven layer comprised of needle-shaped crystal is subjected to the gold plating and covered with the light permissible interlaminar insulating layer (the adhesive for electroless plating of Example 1 indicates the light permissibility), so that the outer layer copper pattern is bright and is very excellent in the design property.

EXAMPLE 9

In this example, the build-up multilayer printed circuit board is produced in the same manner as in Example 1 except that the surface of the Cu—Ni—P alloy roughened layer 9 is subjected to a vacuum evaporation treatment with platinum instead of the substitution formation of the tin plated layer 10 to form a vapor deposited film having a thickness of 0.5 μm.

Comparative Example 1

The build-up multilayer printed circuit board is produced in the same manner as in Example 1 except that the surface of the Cu—Ni—P alloy roughened layer 9 is not subjected to a plating for the substitution-formation of the tin plated layer 10.

Figure 7A:
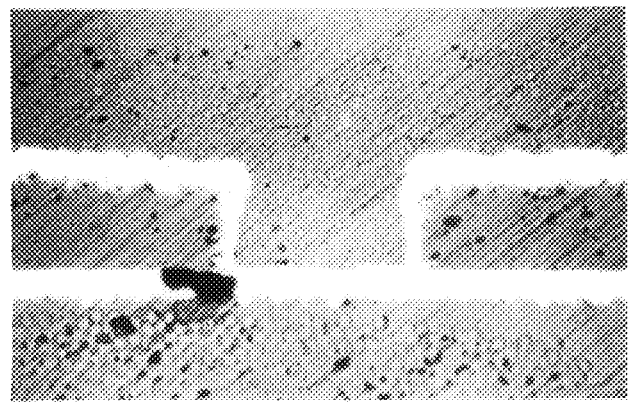
FIGS. 7(a)–(c) are microphotographs showing sectional structures of patterns formed on the substrate in the conventional multilayer printed circuit boards, respectively.
Figure 7B:
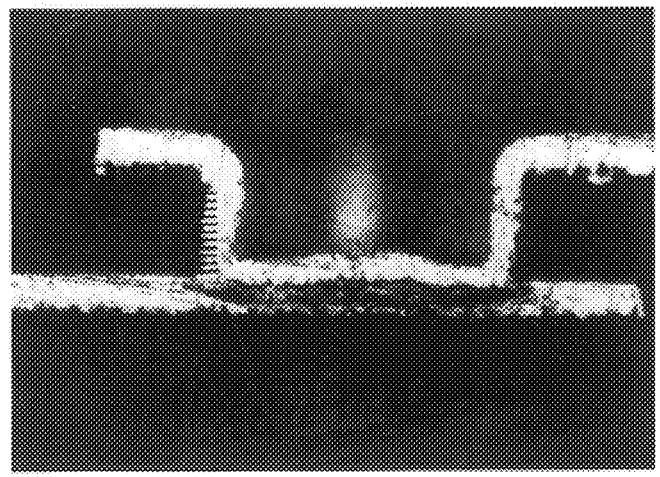
Figure 7C:
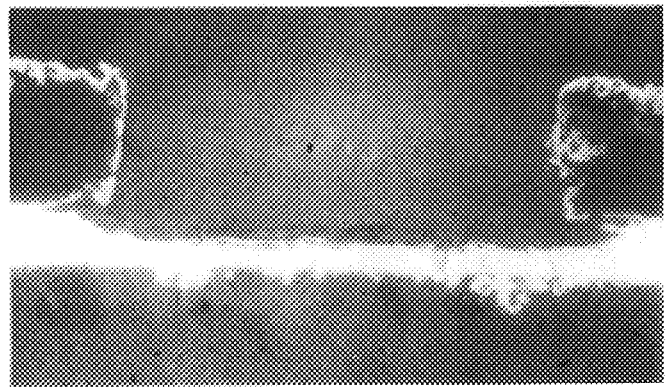
Figure 8:
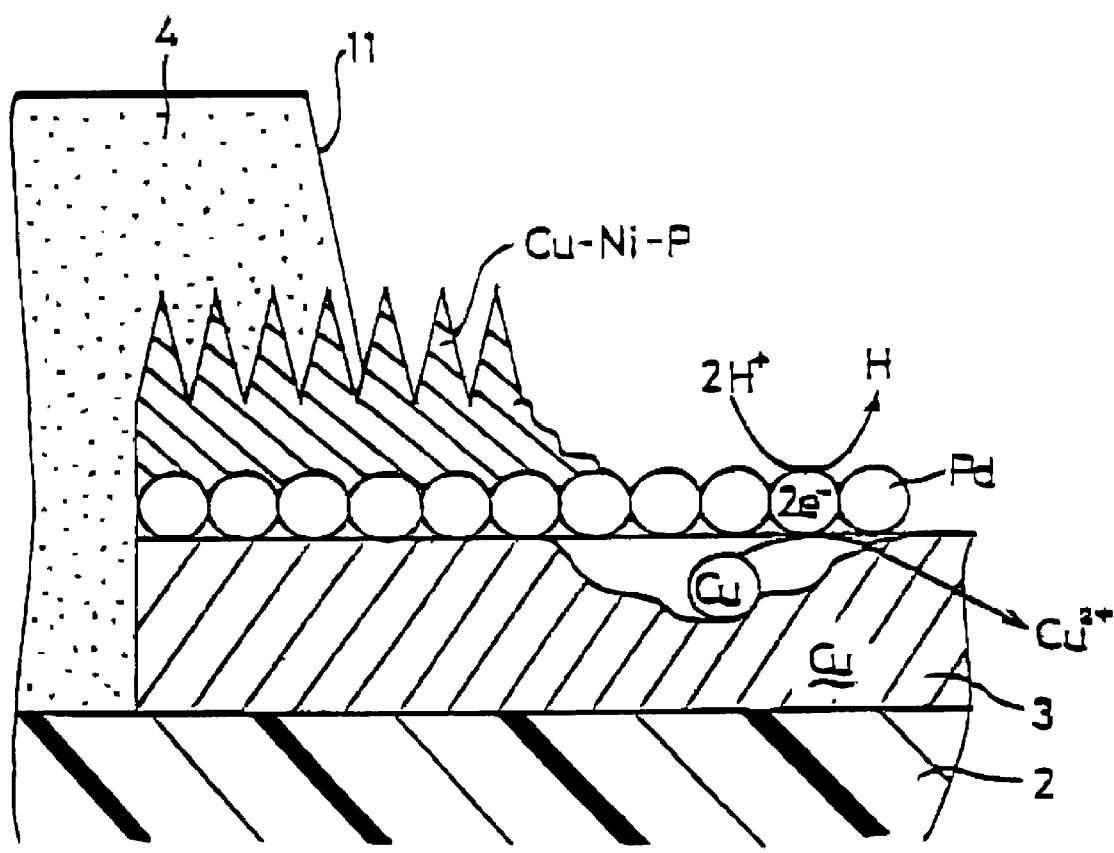
FIG. 8 is a diagrammatic view illustrating a theory of dissolving via-hole portion in the multilayer printed circuit board according to the conventional technique.

In this comparative example, the Cu—Ni—P alloy roughened layer 9 is left to stand for 24 hours and immersed in water and taken out therefrom to observe water repelling phenomenon. As seen from microphotographs of FIGS. 7a–7c showing a dissolution state of a via-hole portion, the dissolution of the outer layer copper pattern is observed.

As to the thus obtained multilayer printed circuit boards of Examples 1–9 and Comparative Example 1, the appearance, section of via-hole portion, presence or absence of gap between the uneven layer and the interlaminar insulating layer, and presence or absence of cracks after heat cycle test at 1000 cycles of −65° C.–125° C. are measured to obtain results as shown in Table 1.

As seen from the results of this table, in the multilayer printed circuit boards according to the invention, the inner layer copper pattern provided at its surface with the fine uneven layer is covered and protected with the metal layer containing one or more of metals having an ionization tendency not lower than that of copper but not higher than that of titanium, or the noble metal layer, so that there is no problem in the appearance, via-hole section, gap and cracks and hence the appearance and reliability are excellent.

TABLE 1

|  | Appearance*1 | Via-hole*2 | Gap*3 | Heat cycle*4 |
|---|---|---|---|---|
| Example 1 | ○ | ○ | ○ | ○ |
| Example 2 | ○ | ○ | ○ | ○ |
| Example 3 | ○ | ○ | ○ | ○ |
| Example 4 | ○ | ○ | ○ | ○ |
| Example 5 | ○ | ○ | ○ | ○ |
| Example 6 | ○ | ○ | ○ | ○ |
| Example 7 |  |  |  |  |
| titanium | ○ | ○ | ○ | ○ |
| aluminum | ○ | ○ | ○ | ○ |
| iron | ○ | ○ | ○ | ○ |
| thallium | ○ | ○ | ○ | ○ |
| bismuth | ○ | ○ | ○ | ○ |
| Example 8 | ○ | ○ | ○ | ○ |
| Example 9 | ○ | ○ | ○ | ○ |
| Comparative Example 1 | X | X | X | X |

(break of outer layer copper pattern due to dissolution of copper)

*1Appearance: evaluated by visual observation. no color change ○   color change X
*2Section of via-hole: evaluated by observing section of via-hole portion by means of a microscope no dissolution of copper ○   dissolution of copper X
*3Gap: evaluated by observing the presence or absence of gap between uneven layer and interlaminar insulating layer by means of a microscope absence of gap ○   presence of gap X
*4Heat cycle: evaluated by observing the presence or absence of cracks or the like after heat cycle test at 1000 cycles of −65° C.–125° C. no crack or peeling ○   cracks and peeling X

EXAMPLE 10

In this example, the build-up multilayer printed circuit board is produced in the same manner as in Example 1 except that the substrate after the completion of the step (3) in Example 1 is immersed in a solution of a preservative consisting essentially of benzotriazole derivative (made by Daiwa Kasei Co., Ltd. trade name: SeeyouGard•D) diluted with water 20–25 times and warmed at 50°–60° C., washed with hot water and then dried.

EXAMPLE 11

In this example, the build-up multilayer printed circuit board is produced in the same manner as in Example 1 except that the substrate after the completion of the step (3) in Example 1 is immersed in a 5% diluted solution of a preservative consisting essentially of benzotriazole derivative (made by Daiwa Kasei Co., Ltd. trade name: VER- ZONE SF-300) at 40°~50° C. for 2~3 minutes, washed with hot water and then dried.

EXAMPLE 12

In this example, the build-up multilayer printed circuit board is produced in the same manner as in Example 1 except that the substrate after the completion of the step (3) in Example 1 is sprayed with a diluted solution of a preservative consisting essentially of 1,2,3-benzotriazole (made by Shipro Chemicals Co., Ltd. trade name: SEETEC B.T-R) in an amount of about 5 g/m$^2$ per Cu area, washed with hot water and then dried.

EXAMPLE 13

In this example, the build-up multilayer printed circuit board is produced in the same manner as in Example 1 except that the substrate after the completion of the step (3) in Example 1 is brushed with a diluted solution of a preservative consisting essentially of tolyltriazole (made by Shipro Chemicals Co., Ltd. trade name: SEETEC T.T-R), washed with hot water and then dried.

EXAMPLE 14

In this example, the build-us multilayer printed circuit board is produced in the same manner as in Example 8 except that the substrate subjected to gold plating in Example 8 is brushed with a diluted solution of a preservative consisting essentially of tolyltriazole (made by Shipro Chemicals Co., Ltd. trade name: SEETEC T.T-R), washed with hot water and then dried.

As to the thus obtained build-up multilayer printed circuit boards of Examples 10–14, PCT test (Pressure Cooker Test) is carried out under conditions of a pressure of 2 atmospheres, a temperature of 121° C. and a humidity of 100%. As a result, poor appearance is not observed even after the PCT test and also the electric resistance in the via-hole portion is unchangeable as compared with the multilayer printed circuit boards of Examples 1–9.

Furthermore, the section observation, the presence or absence of gap between the uneven layer and the interlaminar insulating layer and presence or absence of cracking after the heat cycle test of 1000 cycles at −65° C.–125° C. are carried out in the same manner as in Examples 1–9. As a result, there is no dissolution of copper pattern and gap between the uneven layer and the interlaminar insulating layer, and further the breakage through the heat cycle test and occurrence of cracking are not observed.

Comparative Example 2

The PCT test (Pressure Cooker Test) is carried out with respect to the multilayer printed circuit board obtained in Example 1 under conditions of a pressure of 2 atmospheres, a temperature of 121° C. and a humidity of 100%. As a result, the color change is observed. Moreover, when the section is observed by means of a scanning electron microscope (SEM), the copper pattern and copper-nickel-phosphorus alloy layer are dissolved.

Comparative Example 3

In this comparative example, the build-up multilayer printed circuit board is produced in the same manner as in Example 1 except that air bubbling is carried out in the water washing treatment after the soft etching treatment. In this case, the oxygen concentration dissolved in the water washing bath is 8.8 ppm as measured by means of a dissolved oxygen meter (Model: M-26074) made by Orbisfare Laboratories (Swiss). As a result, the plated alloy may not be deposited when the water washing treatment is carried out with the air bubbling.

Comparative Example 4

In this comparative example, the build-up multilayer printed-circuit board is produced in the same manner as in Example 1 except that Cu—Ni—P alloy plating is carried out so as to control the distance from the plating solution surface to the upper end of the substrate to be treated to a position of 80 mm. In the thus obtained multilayer printed circuit board, undeposited portion of Cu—Ni—P needle-shaped crystal plated alloy is not observed.

Moreover, the invention is not limited to the above examples and is possible to be changed into the following embodiments.

(1) The invention is applicable to multilayer printed circuit boards of two-layer, three-layer, five-layer, six-layer, seven-layer, eight-layer and the like in addition to the multilayer printed circuit board 1 of four-layer. In this case, the Ni—P—Cu alloy roughened layer is formed on the upper surface of the outer layer copper pattern 6 and further covered with the metal layer containing one or more of metals having an ionization tendency not lower than that of copper but not higher than that of titanium and then the interlaminar insulating layer 4 is formed thereon.

(2) In the claims copper-cobalt layer, copper-cobalt-phosphorus layer, or the reduction layer in the black oxide layer formed by oxidation and reduction treatments of the inner layer copper pattern can be formed instead of copper-nickel layer or copper-nickel-phosphorus layer.

INDUSTRIAL APPLICABILITY

As mentioned above, according to the invention, the dissolution of surface portion in the inner layer copper pattern and the like can surely be prevented and also the adhesion property between the inner layer copper pattern and the interlaminar resin insulating layer can be improved, so that the multilayer printed circuit board having excellent appearance and reliability can easily be provided.

Furthermore, the step control is easy, which contributes to decrease the cost.

We claim:

1. A build-up multilayer printed circuit board, comprising:
    an inner layer copper pattern;
    a fine uneven layer on the inner layer copper pattern;
    a metal layer on the fine uneven layer, the metal layer comprising at least one metal having an ionization tendency not lower than that of copper but not higher than that of titanium selected from the group consisting of titanium, aluminum zinc, iron, indium, thallium, cobalt, nickel, tin, lead, and bismuth;
    an interlaminar insulating layer on the metal layer; and
    an outer layer copper pattern on the interlaminar insulating layer.

2. A build-up multilayer printed circuit board, comprising:
    an inner layer copper pattern;
    a fine uneven layer on the inner layer copper pattern;
    a metal layer on the fine uneven layer, the metal layer comprising at least one metal selected from the group consisting of titanium, aluminum, zinc, iron, indium, thallium, cobalt, nickel, tin, lead, and bismuth;
    an interlaminar insulating layer on the metal layer;

an outer layer copper pattern on the interlaminar insulating layer; and a via-hole connecting the inner layer copper pattern to the outer layer copper pattern through the fine uneven layer and the metal layer, the via-hole being formed in an opening portion which locally exposes the metal layer through the interlaminar insulating layer.

3. The build-up multilayer printed circuit board of claim 1, wherein the fine uneven layer comprises a needle-shaped layer formed of a member selected from the group consisting of copper-nickel alloy and copper-nickel-phosphorus alloy.

4. The build-up multilayer printed circuit board of claim 1, wherein the metal layer on the fine uneven layer has a thickness less than a thickness of the fine uneven layer.

5. The build-up multilayer printed circuit board of claim 1, wherein the fine uneven layer comprises a copper-nickel-phosphorus alloy layer having a thickness of 0.5–7.0 $\mu$m, and wherein the metal layer on the fine uneven layer comprises a tin layer having a thickness of 0.01–1.0 $\mu$m.

6. The build-up multilayer printed circuit board of claim 1, wherein the metal layer on the fine uneven layer includes a preservative adhered to a surface thereof.

7. The build-up multilayer printed circuit board of claim 6, wherein the preservative is selected from the group consisting of 1,2,3-benzotriazole, tolyltriazole, and derivatives thereof.

8. A build-up multilayer printed circuit board, comprising:
an inner layer copper pattern;
a fine uneven layer on the inner layer copper pattern;
a noble metal layer on the fine uneven layer;
an interlaminar insulating layer on the noble metal layer; and
an outer layer copper pattern on the interlaminar insulating layer.

9. A build-up multilayer printed circuit board, comprising:
an inner layer copper pattern;
a fine uneven layer on the inner layer copper pattern;
a noble metal layer on the fine uneven layer;
an interlaminar insulating layer on the noble metal layer;
an outer layer copper pattern on the interlaminar insulating layer; and
a via-hole connecting the inner layer copper pattern to the outer layer copper pattern through the fine uneven layer and the metal layer, the via-hole being formed in an opening portion which locally exposes the metal layer through the interlaminar insulating layer.

10. The build-up multilayer printed circuit board of claim 8, wherein the noble metal is selected from the group consisting of gold, platinum, and mixtures thereof.

11. The build-up multilayer printed circuit board of claim 8, wherein the fine uneven layer comprises a needle-shaped layer formed of a member selected from the group consisting of copper-nickel alloy and copper-nickel-phosphorus alloy.

12. The build-up multilayer printed circuit board of claim 8, wherein the noble metal layer has a thickness less than a thickness of the fine uneven layer.

13. The build-up multilayer printed circuit board of claim 8, wherein the noble metal layer includes a preservative adhered to a surface thereof.

14. The build-up multilayer printed circuit board of claim 13, wherein the preservative is selected from the group consisting of 1,2,3-benzotriazole, tolyltriazole, and derivatives thereof.

15. A method of producing a build-up multilayer printed circuit board, comprising:
forming a fine uneven layer on a surface of an inner layer copper pattern on a substrate;
forming a metal layer comprising at least one metal selected from the group consisting of titanium, aluminum, zinc, iron, indium, thallium, cobalt, nickel, tin, lead, and bismuth;
forming an interlaminar insulating layer comprised of an electroless plating adhesive on at least the metal layer and the substrate;
locally exposing the metal layer through the interlaminar insulating layer with a roughening solution;
applying a catalyst nucleus to a surface of the interlaminar insulating layer; and
forming an outer layer copper pattern on the interlaminar insulating layer through electroless plating.

16. A method of producing a build-up multilayer printed circuit board, comprising:
forming a needle-shaped copper-nickel-phosphorus alloy layer on a surface of an inner layer copper pattern formed on a substrate through an electroless copper-nickel-phosphorus alloy plating;
forming a tin-containing plated film on a surface of the copper-nickel-phosphorus alloy layer through an electroless substitution plating comprising at least tin;
forming an interlaminar insulating layer comprised of an electroless plating adhesive on the tin-containing plated film and the substrate;
forming an opening portion for the formation of a via-hole to locally expose the tin-containing plated film at a given position of the interlaminar insulating layer;
roughening a surface of the interlaminar insulating layer with a roughening solution;
applying a catalyst nucleus to the surface of the interlaminar insulating layer; and
forming an outer layer copper pattern on the interlaminar insulating layer and a via-hole in the opening portion through electroless copper plating.

17. A method of producing a build-up multilayer printed circuit board, comprising:
forming a fine uneven layer on a surface of an inner layer copper pattern formed on a substrate;
forming a noble metal layer on a surface of the fine uneven layer;
forming an interlaminar insulating layer comprised of an electroless plating adhesive on the noble metal layer and the substrate;
locally exposing the noble metal layer through the interlaminar insulating layer;
roughening a surface of the interlaminar insulating layer with a roughening solution;
applying a catalyst nucleus to the surface of the interlaminar insulating layer; and
forming an outer layer copper pattern on the interlaminar insulating layer through electroless plating.

18. A method of producing a build-up multilayer printed circuit board having an inner layer copper pattern provided at a surface with a fine uneven layer, comprising:

controlling dissolved oxygen concentration in a bath at a water washing treatment followed by a soft etching treatment as a pretreatment to not more than 1.0 ppm prior to the formation of the fine uneven layer through an alloy plating treatment.

19. The method of claim 18, wherein the dissolved oxygen concentration in the bath is controlled to not more than 1.0 ppm through inert gas bubbling.

20. The method of claim 18, further comprising:
conducting an alloy plating treatment to form the fine uneven layer on a substrate by immersing the substrate in a plating solution to a depth such that a distance from a surface of the plating solution to an upper end of the substrate is not less than 100 mm.

* * * * *

UNITED STATES PATENT AND TRADEMARK OFFICE
CERTIFICATE OF CORRECTION

PATENT NO.   : 5,827,604
DATED        : October 27, 1998
INVENTOR(S)  : Hiroaki UNO et al.

It is certified that error appears in the above-identified patent and that said Letters Patent is hereby corrected as shown below:

At item [57] line 27, ABSTRACT, (second column, line 1-13) of the printed patent, substitute information as follows:

—A build-up multilayer printed circuit board includes an inner layer copper pattern, a fine uneven layer on the inner layer copper pattern, a metal layer on the fine uneven layer with the metal layer being a noble metal or at least one metal having an ioniziation tendency not lower than that of copper, but not higher than that of titanium, an interlaminar insulating layer on the metal layer, and an outer layer copper pattern on the interlaminar insulating layer. The multilayer printed circuit board has excellent appearance and reliability. A method of producing the multilayer printed circuit board.—

Signed and Sealed this

Twenty-ninth Day of February, 2000

Attest:

Q. TODD DICKINSON

Attesting Officer

Commissioner of Patents and Trademarks

UNITED STATES PATENT AND TRADEMARK OFFICE
CERTIFICATE OF CORRECTION

PATENT NO. : 5,827,604
DATED : October 27, 1998
INVENTOR(S) : H. UNO et al.

It is certified that error appears in the above-identified patent and that said Letters Patent is hereby corrected as shown below:

At column 20, lines 51-53 (claim 1, lines 5-7), delete "having an ionization tendency not lower than that of copper but not higher than that of titanium".

Signed and Sealed this

Eleventh Day of April, 2000

*Attest:*

Q. TODD DICKINSON

*Attesting Officer*     *Director of Patents and Trademarks*